(12) United States Patent
Chen et al.

(10) Patent No.: US 8,293,168 B2
(45) Date of Patent: Oct. 23, 2012

(54) NANOCOMPOSITES WITH HIGH THERMOELECTRIC FIGURES OF MERIT

(75) Inventors: Gang Chen, Carlisle, MA (US); Mildred Dresselhaus, Arlington, MA (US); Zhifeng Ren, Newton, MA (US)

(73) Assignees: Massachusetts Institute of Technology, Cambridge, MA (US); The Trustees of Boston College, Chestnut Hill, MA (US)

( * ) Notice: Subject to any disclaimer, the term of this patent is extended or adjusted under 35 U.S.C. 154(b) by 691 days.

(21) Appl. No.: 12/273,783

(22) Filed: Nov. 19, 2008

(65) Prior Publication Data

US 2009/0068465 A1  Mar. 12, 2009

Related U.S. Application Data

(63) Continuation of application No. 10/977,363, filed on Oct. 29, 2004, now Pat. No. 7,465,871.

(51) Int. Cl.
*B22F 3/105* (2006.01)
*H01L 35/12* (2006.01)

(52) U.S. Cl. ........... 419/52; 419/23; 419/48; 136/236.1; 977/775; 977/778

(58) Field of Classification Search .......... 419/23, 419/32, 48; 136/201, 236.1, 238, 239, 240; 977/776, 777, 778, 779, 784
See application file for complete search history.

(56) References Cited

U.S. PATENT DOCUMENTS

| | | | |
|---|---|---|---|
| 4,588,520 A | 5/1986 | Jayadev | |
| 5,069,868 A * | 12/1991 | Tokiai et al. | 419/23 |
| 5,246,504 A * | 9/1993 | Ohta et al. | 136/201 |
| 5,318,743 A | 6/1994 | Tokiai | |
| 5,531,936 A | 7/1996 | Kanatzidis et al. | |
| 5,614,128 A | 3/1997 | Kanatzidis et al. | |
| 5,618,471 A | 4/1997 | Kanatzidis et al. | |
| 5,723,799 A | 3/1998 | Murayama et al. | |
| 5,763,293 A | 6/1998 | Yamashita et al. | |
| 5,883,563 A | 3/1999 | Horio | |
| 5,897,945 A | 4/1999 | Lieber et al. | |
| 5,929,351 A | 7/1999 | Kusakabe | |
| 5,965,841 A | 10/1999 | Imanishi | |
| 5,973,050 A | 10/1999 | Johnson et al. | |
| 5,989,487 A * | 11/1999 | Yoo et al. | 266/249 |
| 6,013,204 A | 1/2000 | Kanatzidis et al. | |
| 6,060,656 A | 5/2000 | Dresselhaus et al. | |
| 6,069,312 A | 5/2000 | Fleurial | |
| 6,147,293 A | 11/2000 | Trauchi | |
| 6,207,886 B1 | 3/2001 | Kusakabe | |
| 6,222,242 B1 | 4/2001 | Konishi | |
| 6,225,548 B1 | 5/2001 | Sakakibara et al. | |
| 6,235,981 B1 | 5/2001 | Miyoshi | |
| 6,274,802 B1 | 8/2001 | Fukuda | |
| 6,297,441 B1 | 10/2001 | Macris | |
| 6,312,617 B1 | 11/2001 | Kanatzidis et al. | |
| 6,313,392 B1 | 11/2001 | Sato | |
| 6,403,875 B1 | 6/2002 | Karino | |
| 6,440,768 B1 * | 8/2002 | Konishi et al. | 438/54 |
| 6,444,896 B1 | 9/2002 | Harman et al. | |
| 6,525,260 B2 | 2/2003 | Yamashita | |
| 6,596,226 B1 | 7/2003 | Simard | |
| 6,605,772 B2 | 8/2003 | Harman et al. | |
| 6,617,504 B2 | 9/2003 | Kajihara | |
| 6,653,548 B2 | 11/2003 | Yamashita | |
| 6,670,539 B2 | 12/2003 | Heremans et al. | |
| 6,673,996 B2 | 1/2004 | Caillat | |
| 6,743,973 B2 | 6/2004 | Hayashi | |
| 6,840,844 B2 | 1/2005 | Miyashita et al. | |
| 6,858,154 B2 | 2/2005 | Suzuki et al. | |
| 7,002,071 B1 | 2/2006 | Sadatomi et al. | |
| 7,067,733 B2 | 6/2006 | Horio et al. | |
| 7,465,871 B2 | 12/2008 | Chen et al. | |
| 2002/0026856 A1 | 3/2002 | Suzuki et al. | |
| 2002/0053359 A1 | 5/2002 | Harman et al. | |
| 2002/0100499 A1 | 8/2002 | Hayashi | |
| 2002/0170590 A1 | 11/2002 | Heremans et al. | |
| 2003/0047204 A1 | 3/2003 | Fleurial et al. | |
| 2003/0089391 A1 * | 5/2003 | Fukudome et al. | 136/227 |
| 2003/0099279 A1 | 5/2003 | Venkatasubramanian et al. | |
| 2003/0168094 A1 | 9/2003 | Miyasita | |
| 2004/0187905 A1 | 9/2004 | Heremans et al. | |
| 2005/0284512 A1 | 12/2005 | Heremans et al. | |
| 2006/0053969 A1 | 3/2006 | Harada | |
| 2006/0102224 A1 | 5/2006 | Chen et al. | |
| 2006/0118158 A1 | 6/2006 | Zhang et al. | |
| 2006/0118161 A1 | 6/2006 | Horio | |

(Continued)

FOREIGN PATENT DOCUMENTS

DE  19627389  1/1997

(Continued)

OTHER PUBLICATIONS

Written Opinion in corresponding application PCT/US2007/086291.

(Continued)

*Primary Examiner* — Roy King
*Assistant Examiner* — Ngoclan T Mai
(74) *Attorney, Agent, or Firm* — Nutter McClennen & Fish LLP; Reza Mollaaghababa; Thomas J. Engellenner

(57) ABSTRACT

The present invention is generally directed to nanocomposite thermoelectric materials that exhibit enhanced thermoelectric properties. The nanocomposite materials include two or more components, with at least one of the components forming nano-sized structures within the composite material. The components are chosen such that thermal conductivity of the composite is decreased without substantially diminishing the composite's electrical conductivity. Suitable component materials exhibit similar electronic band structures. For example, a band-edge gap between at least one of a conduction band or a valence band of one component material and a corresponding band of the other component material at interfaces between the components can be less than about $5k_BT$, wherein $k_B$ is the Boltzman constant and T is an average temperature of said nanocomposite composition.

10 Claims, 8 Drawing Sheets

U.S. PATENT DOCUMENTS

| | | |
|---|---|---|
| 2006/0243314 A1 | 11/2006 | Ota |
| 2006/0249704 A1 | 11/2006 | Ren |
| 2006/0272697 A1 | 12/2006 | Kanatzidis et al. |

FOREIGN PATENT DOCUMENTS

| | | |
|---|---|---|
| EP | 1187230 | 3/2002 |
| JP | 925526 | 1/1997 |
| JP | 10-070315 A | 3/1998 |
| JP | 2000-261052 A | 9/2000 |
| JP | 2002076452 A | 3/2002 |
| JP | 2003031860 A | 1/2003 |
| JP | 2003251600 | 9/2003 |
| WO | WO-0012600 | 3/2000 |
| WO | WO-2004055912 | 7/2004 |

OTHER PUBLICATIONS

Ni, et al., "Synthesis and thermoelectric properties of Bi2Te3 based nanocomposites," Journal of Alloys and Compounds, Elsevier Sequoia, Lausanne, CH, vol. 397, No. 1-2, Jul. 19, 2005.

JM. Essick et al, "Conduction- and valence-band offsets at the hydrogenated amorphous silicon-carbon/crystalline silicon interface viacapacitance techniques". Phys. Rev. B. 54, 4885-4890. (1996).

J.M. Essick et al, "Band offsets and deep defect distribution in hydrogenated amorphous silicon-crystalline silicon heterostructures", Appl. Phys. Lett. 55, 1232-1234. (1989).

Chen et al., "Recent Developments in Thermoelectric Materials," International Materials Reviews, vol. 48, p. 45-66, (2003).

Hsu at al., "Cubic AgPb$_m$SbTe$_{z+m}$: Bulk Thermoelectic Materials with High Figure of Merit," Science, vol. 303, p. 818-821, (Feb. 2004).

Heremans et al., "Thermopower Enhancement in Lead Telluride Nanostructures," Physical Review, vol. 70, p. 115334-1-115334-5, (Sep. 2004).

Science vol. 271, "Small Clusters Hit the Big Time," 920-922 (Feb. 20, 1996).

Zhu et al., J. Appl. Phys., "Coexisting photoluminescence of Si and Ge nanocrystals in Ge/Si thin film," 90, 5318-5321 (2001).

Taylor et al., "Solution Synthesis of Germanium Nanocrystals Demonstrating Quantum Confinement," Chem. Mater. 10, 22-24 (1998).

Murray et al., "Synthesis and Characterization of Nearly Monodisperse CdE (E=S, Se, Te) Semiconductor Nanocrystallites," J. Am. Chem. Soc. 1993, 115, 8706-8715.

Kane et al., J. Phys. Chem., "Theoretical Study of the Electronic Structure of PbS Nanoclusters," 1996, 100, 7928-7932.

Pan et al., "Nanobelts of Semiconducting Oxides," Science 2001, 291, 1947-1949.

Ebbesen et al., "Large-scale synthesis of carbon nanotubes," Nature 1992, 358, 220-222.

Lao et al., "Zn0 Nanobridges and Nanonails," Nano Lett. 2003, 3, 235-238.

Li et al., "MoS$_2$ nanoflowers and their field-emission properties," Appl. Phys. Lett. 2003, 82, 1962-1964.

Sun et al., "Shape-Controlled Synthesis of Gold and Silver Nanoparticles," Science 2002, 298, 2176-2179.

Saito et al., "Carbon nano-cages created as cubes," Nature 1998, 392, 237-238.

Maeda et al., "Visible photoluminescence of Ge microcrystals embedded in Si0$_2$ glassy matrices," Appl. Phys. Lett. 1991, 59, 3168-3170.

Paine et al., "Visible photoluminescence from nanocrystalline Ge formed by H$_2$ reduction of Si$_{0.6}$Ge$_{0.4}$O$_2$," Appl. Phys. Lett. 1993, 62, 2842-2844.

Bettotti et al., "Silicon nanostructures for photonics," J. Phys.: Condens. Matter 2002, 14, 8253-8281.

She et al., "Impact of Crystal Size and Tunnel Dielectric on Semiconductor Nanocrystal Memory Performance," IEEE Trans. Electron Dev. 2003, 50, 1934-1940.

Bostedt et al., "Evidence for cubic phase in deposited germanium nanocrystals," J. Phys.: Condens. Matter 2003, 15, 1017-1028.

Oku et al., "Formation and photoluminescence of Ge and Si nanoparticles encapsulated in oxide layers," Mater. Sci. Eng. B. 2000, B74, 242-247.

Lin et al., "Structural and optical properties of germanium nanoparticles," J. Appl. Phys. 2002, 91, 1525-1528.

Das et al., "Self-assembled Ge nanostructures on polymer-coated silicon: Growth and characterization," Appl. Phys. Lett. 2000, 77, 951-953.

Zhu et al., "Enhancement of photoluminescence in Ge nanoparticles by neighboring amorphous C in composite Ge/C thin films," J. Appl. Phys. 2003, 93, 6029-6033.

Yang et al., "Sol-Gel Preparation and Photoluminescence of Size Controlled Germanium Nanoparticles Embedded in a SiO$_2$ Matrix," J. Phys. Chem B 2003, 107, 13319-13322.

Taylor et al., "Solutions Synthesis and Characterization of Quantum Confined Ge Nanoparticles," Chem. Mater. 1999, 11, 2493-2500.

Taylor et al., "Solution preparation of Ge nanoparticles with chemically tailored surfaces," Mater. Sci. Eng. B 2002, B96, 90-93.

Hope-Weeks, "Time dependent size and shape control of germanium nanocrystals," Chem. Commun. 2003, 2980-2981.

Wilcoxon et al., "Synthesis and optical properties of colloidal germanium nanocrystals," Phys. Rev. B 2001, 64, 035417-1-035417-9.

Kornowski e tal., "nanometer-Sized Colloidal Germanium Particles: Wet-Chemical Synthesis, Laser-Induced Cyrstallization and Particle Growth," Adv. Mater. 1993, 5, 634-636.

Gerion et al., "Solution Synthesis of Germanium Nanocrystals: Success and Open Challenges," Nano Lett. 2004, 4, 597-602.

Lu et al., "Synthesis of Germanium Nanocrystals in High Temperature Supercritical Fluid Solvents," Nano Lett. 2004, 5 969-974.

Peng et al., "Mechanisms of the Shape Evolution of CdSe Nanocrystals," J. Am. Chem. Soc. 2001, 123, 1389-1395.

Pileni, "The role of soft colloidal templates in controlling the size and shape of inorganic nanocrystals," Nat. Mater. 2003, 2, 145-150.

Johnson et al., "Growth and form of gold nanorods prepared by seed-mediated, surfactant-directed synthesis," J. Mater. Chem. 2002, 12, 1765-1770.

Goldsmid, "Thermoelectric Refrigeration," Plenum Press, New York, 1964.

Chen et al., "Heat Transfer in Nanostructures for Solid-State Energy Conversion," ASME Journal of Heat Transfer, 2002, 124, pp. 242-252.

Ioffe, "Semiconductor Thermoelements and Thermoelectric Cooling, Infosearch Limited," London, 1957.

Harman et al., "Thermoelectric Quantum-Dot Superlattices with High ZT," Journal of Electronic Materials, 29, pp. L1-L4, 2000.

Venkatasubramanian et al., "Thin-film thermoelectric devices with high room-temperature figures of merit," Nature, 413, pp. 597-602, 2001.

Hicks et al., "Effect of quantum-well structures on the thermoelectric figure of merit," Physical Review B, 47, pp. 12727-12731, 1993.

Hicks et al., "Experimental study of the effect of quantum-well structures on the thermoelectric figure of merit," Physical Review B, 53, 10493-10496, 1996.

Koga et al., "Experimental proof-of-principle investigation of enhanced Z$_{3D}$T in (001) oriented Si/Ge superlattices," Applied Physics Letters, 77, pp. 1490-1492, 2000.

Springholz et al., "Self-Organized Growth of Three-Dimensional Quantum-Dot Crystals With fcc-Like Stacking and a Tunable Lattice Constant," Science, 282, pp. 734-737, 1998.

Chen, "Thermal conductivity and ballistic-phonon transport in the cross-plane direction of superlattices," Physical Revies B., 57, pp. 14958-14973, 1998.

Goodson et al., "Heat Conduction in Novel Electronic Films" Annual Review of Materials Science, 29, pp. 261-293, 1999.

Venkatasubramanian, "Lattice thermal conductivity reduction and phonon localizationlike behavior in superlattice structures," Physical Review B, 61, pp. 3091-3097, 2000.

Song et al., "Thermal conductivity of skutterudite thin films and superlattices," Applied Physics Letters, 77, pp. 3854-3856, 2000.

Murray et al.,"Synthesis and Characterization of Monodisperse Nanocrystals and Close-Packed Nanocrystal Assemblies," Annual Review of Materials Science, 30, pp. 545-610, 2000.

Fang et al., "Nanocrystalline bismuth synthesized via an in situ polymerization-microemulsion process," Materials Letters, 42, pp. 113-120, 2000.

Foos et al., "Synthesis of Nanocrystalline Bismuth in Reverse Micelles," Journal of the American Chemical Society, 122, pp. 7114-7115, 2000.

Fang et al., "Self-assembled bismuth nanocrystallites," Chemical Communication, pp. 1872-1873, 2001.

Mulvaney et al., "Surface Chemistry of Colloidal Gold—Deposition of Lead and Accompanying Optical Effects," Journal of Physical Chemistry, 96, pp. 10419-10424, 1992.

Mulvaney et al., "Silica encapsulation of quantum dots and metal clusters," Journal of Materials Chemistry, 10, pp. 1259-1270, 2000.

Liz-Marsan et al., "Core-Shell Nanoparticles and Assemblies Thereof," Handbook of Surfaces and Interfaces of Materials edited by H.S. Nalawa, Academic Press, 189-237, 2001.

Lieber, "One-Dimensional Nanostructures: Chemistry, Physics & Applications," Solid State Communication, 107, pp. 607-616, 1998.

Morales et al., "A Laser Ablation Method for the Synthesis of Crystalline Semiconductor Nanowires," Science, 279, pp. 208-211, 1998.

Wei et al., "Synthesis of Single Crystal Bismuth-Telluride and Lead-Telluride Nanowires for New Thermoelectric Materials," MRS Proc., V. 581, pp. 219-223, 2000.

Gudiksen et al., "Growth of nanowire superlattice structures for nanoscale photonics and electronics," Nature, 415, pp. 617-620, 2002.

Wu et al., "Block-by-Block Growth of Single-Crystalline Si/SiGe Superlattice Nanowires," Nanoletters, 2, pp. 83-86, 2002.

Zhang et al., "Processing and Characterization of Single-Crystalline Ultrafine Bismuth Nanowires," Chemistry of Materials, 11, pp. 1659-1665, 1999.

Heremans et al., "Bismuth nanowire arrays: Synthesis and galvanomagnetic properties," Physical Review B, 61, pp. 2921-2930, 2000.

Sapp et al., "Template Synthesis of Bismuth Telluride Nanowires," Advanced Materials, 11, pp. 402-404, 1999.

Prieto et al., "Electrodeposition of Ordered $Bi_2Te_3$ Nanowire Arrays," Journal of the American Chemical Society, 123, pp. 7160-7161, 2001.

Takahashi et al., "Electrodeposition of PBS Films From Acidic Solution," Journal of Electroanalytical Chemistry, 359, pp. 281-286, 1993.

Molin et al., "Electrochemical deposition of PbSe thin-films from aqueous-solutions," Thin Solid Films, 265, pp. 3-9, 1995.

Saloniemi et al., "Electrodeposition of lead selenide thin films," Journal of Materials Chemistry, 8, pp. 651-654, 1998.

Saloniemi et al., "Electrodeposition of PbTe thin films," Thin Solid Films, 326, pp. 78-82, 1998.

Routkevitch et al., "Nonlithographic Nano-Wire Arrays: Fabrication, Physics, and Device Applications," IEEE Transactions on Electron Devices, 43, pp. 1646-1658, 1996.

Ren et al., "Synthesis of Large Arrays of Well-Aligned Carbon Nanotubes on Glass," Science 282, pp. 1105-1107, 1998.

Rowe, D.M., Ed., Handbook of Thermoelectrics, CRC Press, Boca Raton, Florida, 1995.

Yang et al., "Genometric Effects on the Transient Cooling of Thermoelectric Coolers," MRS Proc., vol. 691, pp. I G8.27.1-G8.27.6 (2002).

Jacquot et al., "Fabrication and Modeling of a Thermoelectric Microgenerator," $21^{st}$ International Conference on Thermoelectroncis, pp. 561-564 (2002).

Chen, G., "Size and Interface Effects on Thermal Conductivity of Superlattices and Periodic Thin-Film Structures," ASME Journal of Heat Transfer, vol. 119, pp. 220-229, 1997.

Yang et al., Lattice Dynamics Study of Anisotropic Heat Conduction in Superlattices, Microscale Thermophysical Engineering, vol. 5, pp. 107-116, 2001.

Mrotzek et al,. "Search for New Thermoelectric Materials through Exploratory Solid State Chemistry. The Quaternary Phases $A_{1+x}M_{3-2x}Bi_{7+x}A_{1-x}M_3-xBi_{11-x}Se_{20}, a_{1-x}M_{4-x}Bi_{11+x}Se_{21}$ and $A_{1-x}M_{5-x}Bi_{11+x}Se_{22}$ (A=K, Rb, Cs, M=Sn, Pb) and the Homologous Series $A_M[M_6Se_6]_m[M_{5+n}Se_{9+n}]$" MRS Proceedings691, pp. G.5.1.1-G.5.1.12 (2001).

Ghamaty et al., "Thermal and Electrical Properties of $Si/Si_{0.8}Ge_{0.2}$ and $B_4C/B_9C$ Films," Proc. ICT98, pp. 206-209.

Bennett, G.L., "Space Applications, in CRC Handbook of Thermoelectrics," Ed.D.M. Rowe, CRC Press, Boca Raton, pp. 515-537 (1995).

Kanatzidis, M.G., "New Bulk Materials for Thermoelectric Applications: Synthetic Strategies Based on Phase Homologies," Michigan State University (2003).

Borca-Tasciuc et al., "Thermal conductivity of symmetrically strained Si/Ge superlattices," Superlattices and Microstructures, vol. 28, pp. 119-206 (2000).

Koga et al., "Mechanism of the enhanced thermoelectric power in (111)-oriented n-type $PbTe/Pb_{1-x}Eu_xTe$ multiple quantum wells," Phys. Rev. B., 1999, 60, 14286-14293.

Vining, C.B., "Silicon Germanium," in CRC Handbook of Thermoelectrics, ed. Rowe, D.M., CRC Press, Boca Raton, pp. 328-337 (1995).

Scoville et al., "Thermal Conductivity Reduction in SiGe Alloys by the Addition of Nanophase Particles," Nanostructured Materials, 5, 207-23, 1995.

Rowe et al., "Comments on the thermoelectric properties of pressure-sintered $Si_{0.8}Ge_{0.2}$ thermoelectic alloys," Journal of Applied Physics, v. 73, pp. 4683-4685 (1993).

Harman et al., "Quantum Dot Superlattice Thermoelectric Materials and Devices," Science 297, pp. 2229-2232 (2002).

Sun et al., "Experimental Study of the Effect of the Quantum Well Structures on the Thermoelectric Figure of Merit in $Si/Si_xGe_{1-x}$ System," Proceedings of Int. Conf. Thermoelectrics, ICT'99, pp. 652-655 (1999).

Morup et al., "Crystal growth and the steady-state grain size during high-energy ball-milling," Europhysics Letters, 56, pp. 441-446 (2001).

Lam et al., "Large-scale synthesis of ultrafine Si nanoparticles by ball milling," Journal of Crystal Growth, 220, pp. 466-470 (2000).

Lao et al., "Hierarchical ZnO Nanostructures," Nano letters, pp. 1287-1291 (2002).

Lai et al., "Melting point depression of Al clusters generated during the early stages of film growth: Nanocalorimetry measurements," Applied Physics Letters, 72, pp. 1098-1100 (1998).

Lu et al., "Melting and superheating of low-dimensional materials," Current Opinion in Solid State and Materials Science, 5, pp. 39-44 (2001).

Yang et al., "Measurement of anisotropic thermoelectric properties in superlattices," Applied Physics Letters, 81, pp. 3588-3590 (2002).

Lin et al., "Semimetal-semiconductor transition in $Bi_{1-x}Sb_x$ alloy nanowires and their thermoelectric properties," Applied Physics Letters, 81, pp. 2403-2405 (2002).

Borca-Tasciuc et al., "Thermal Conductivity of InAs/AlSb Superlattices," Microscale Thermophysical Engineering, 5, pp. 225-231 (2001).

Hsu, et al., "Cubis $AgPB_mSbTe_{2+m}$ Bulk Thermoelectric Materials with High Figure of Merit," vol. 303, Science, Feb. 6, 2004.

Huang, et al., "The thermoelectric performance of $ZrNiSn/ZrO_2$ composites," Solid State Communications, Nov. 13, 2003.

Ohnaka, et al., Thermoelectric properties of $(Bi_{0.25}Sb_{0.75})_2Te_3$ with ceramic addition, Proceedings of the $12^{th}$ International Conf. on Thermoelectrics, Nov. 9-11, 2003.

Harris, et al., "Thermal Conductivity Reduction of SiGe Nanocomposites," pp. S7.21-S.7.2.6, Mat. Res. Soc. Symp. Proc. vol. 793 (2004).

Ronggui, Yang et al., "Thermal conductivity modeling of periodic two-dimensional nanocomposites", Physical Review B APS through AIP USA, vol. 69, No. 19, May 15, 2004 (p. 195316-1, XP002354075.

Zhao, et al., "Bismuth telluride nanotubes and the effects on the thermoelectric properties of nanotube-containing nanocomposites" Applied Physics Letters, AIPR, American Institute of Physics, vol. 86, No. 6, Feb. 3, 2005, p. 62111, Xp012066267.

Hohyun, Lee et al., "Thermoelectric properties of Si/Ge nano-composite" Thermoelectrics 2005, Jun. 10-23, 2005, pp. 269-271, XP010842911.

Lauhon, et al., "Epitaxial core-shell and core-multishell nanowire heterostructures," Nature, Nov. 7, 2002, vol. 420.
Office Action dated Aug. 31, 2009 in corresponding Chinese patent application 200580044842.6.
International Search Report and Written Opinion for PCT/US2005/039362 mailed Jan. 28, 2008.(18 pages).
Ngiam et al., J. Appl. Phys.. "Synthesis of Ge nanocrystals embedded in a Si host matrix," 76, 8201-8203 (1994).
Korean Office Action dated Feb. 23, 2012 for application No. 10-2007-7012151. (10 pages).
Office Action dated Feb. 23, 2011 in corresponding U.S. Appl. No. 11/949,353.
DiSalvo, Francis J., "Thermoelectric Cooling and Power Generation," Jul. 30, 1999, Science, vol. 285, pp. 703-706.
Schilz, J. et al., "Synthesis of thermoelectric materials by mechanical alloying in planetary ball mills", 1999, Powder Technology, 105, pp. 149-154.
Rowe, D.M. et al., "Effect of grain size on the thermoelectric conversion efficiency of semiconductor alloys at hight temperature", Sep. 1980, Applied Energy, vol. 6, Issue 5, abstract.

Otake, Masatoshi et al., "Pulse-current sintering and thermoelectric properties of gas-atomized silicon-germanium pwoders", Jan. 2004, Solid State Ionics, 172, pp. 523-526.
Yang, J. et al., "Thermoelectric properties of p-type (Bi2Te3)x(Sb2Te3)1-x prepared via bulk mechanical alloying and hot pressing", Jun. 2000, Journal of Alloys and Compounds, 309, pp. 225-228.
Zhu, T.J. et al., "Nanostructuring and thermoelectric properties of semiconductor tellurides", Thermoelectrics, 2007, ICT 2007, 26th International Conference On, IEEE, pp. 8-11.
Harris, T. et al., "Thermal conductivity reduction of SiGe nanocomposites", Thermoelectric Materials 2003—Research and Applications Symposium Mater. Res. Soc. Symposium Proceedings vol. 793), 2003, pp. 169-174.
Japanese Office Action issued Jul. 24, 2012 for Application No. 2007-539271 (4 Pages).

* cited by examiner

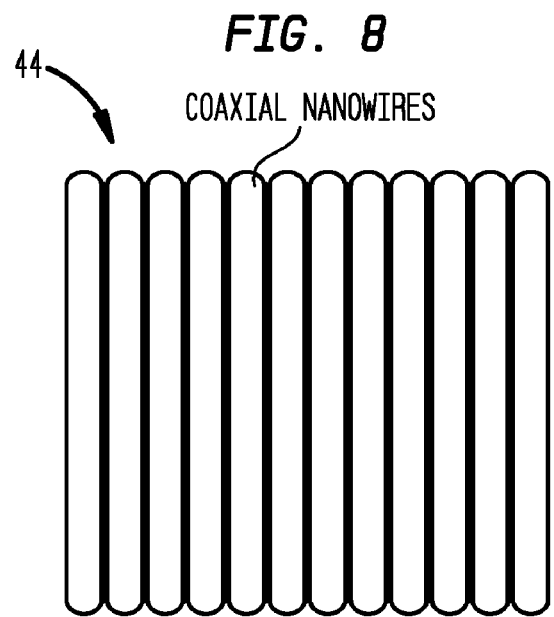
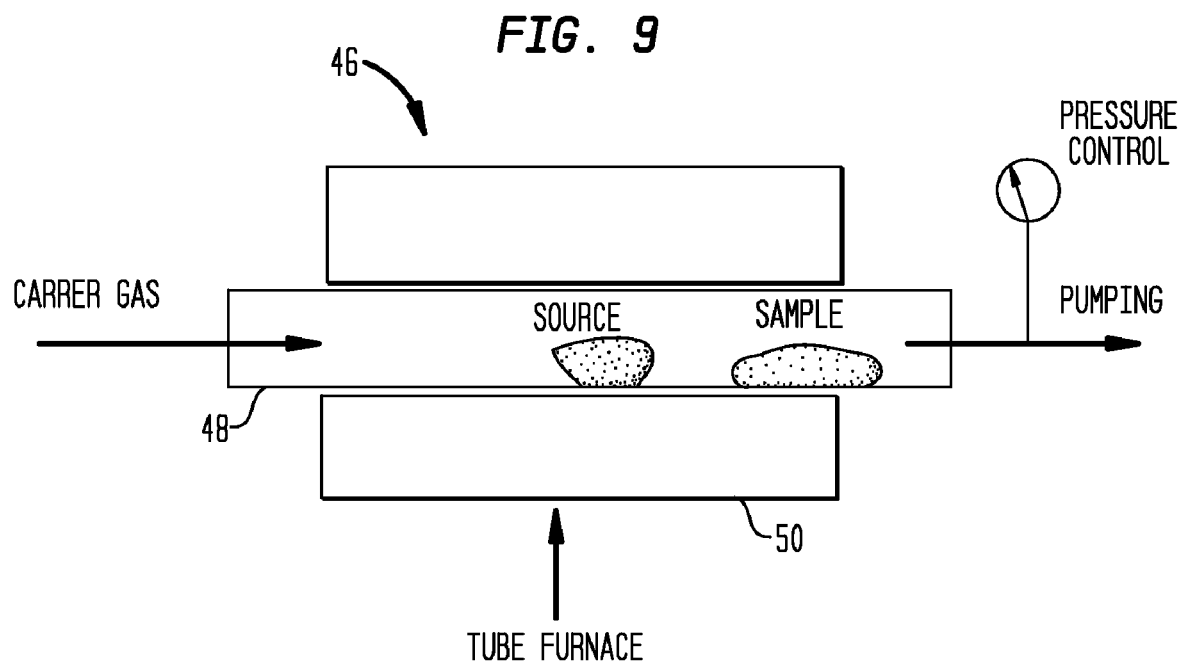

US 8,293,168 B2

NANOCOMPOSITES WITH HIGH THERMOELECTRIC FIGURES OF MERIT

RELATED APPLICATION

This application claims priority as a continuation application to a utility application entitled "Nanocomposites With High Thermoelectric Figures of Merit" having a Ser. No. 10/977,363 filed on Oct. 29, 2004, and incorporates this application by reference in its entirety.

FEDERALLY SPONSORED RESEARCH

This invention was made with government support under Grant No. NAS3-03108 awarded by NASA. The government has certain rights in this invention.

BACKGROUND OF THE INVENTION

The present invention is generally directed to thermoelectric materials and methods for their synthesis and, more particularly, to such materials that exhibit enhanced thermoelectric properties.

Solid-state cooling and power generation based on thermoelectric effects are known in the art. For example, semiconductor devices that employ Seebeck effect or Peltier effect for power generation and heat pumping are known. The utility of such conventional thermoelectric devices is, however, typically limited by their low coefficient-of-performance (COP) (for refrigeration applications) or low efficiency (for power generation applications). A thermoelectric figure-of-merit ($Z=S^2\sigma/k$, where S is the Seebeck coefficient, $\sigma$ is the electrical conductivity, and k is thermal conductivity) is typically employed as the indicator of the COP and the efficiency of thermoelectric devices. In some cases, a dimensionless figure-of-merit (ZT) is employed, where T can be an average temperature of the hot and the cold sides of the device.

Applications of conventional semiconductor thermoelectric coolers are rather limited, as a result of a low figure-of-merit, despite many advantages that they provide over other refrigeration technologies. In power generation applications, low efficiency of thermoelectric devices made from conventional thermoelectric materials with a small figure-of-merit limits their applications in direct conversion of heat to electricity (e.g., conversion of waste heat or heat generated by specially designed sources).

Accordingly, there is a need for enhanced thermoelectric materials, and methods for their fabrication. More particularly, there is a need for thermoelectric materials exhibiting an enhanced figure-of-merit.

SUMMARY OF THE INVENTION

The present invention is generally directed to nanocomposite thermoelectric materials that exhibit enhanced thermoelectric properties. The nanocomposite materials include two or more components, with at least one of the components forming nano-sized structures within the composite material. The components are chosen such that thermal conductivity of the composite is decreased without substantially diminishing the composite's electrical conductivity. Suitable component materials exhibit similar electronic band structures. For example, a band-edge offset between at least the conduction bands or the valence bands of the two component materials can be less than about $5k_BT$, and preferably less than about 3 $k_BT$, wherein $k_B$ is the Boltzman constant and T is an average temperature of the nanocomposite composition.

In one embodiment, the present invention provides a thermoelectric nanocomposite semiconductor composition that includes a plurality of nano-sized structures formed of a first selected semiconductor material, and a plurality of nano-sized structures formed of another semiconductor material intermixed together. The nanosized structures can be, for example, nanoparticles or nanowires. For example, the structures can be formed of two different types of nanoparticles having average diameters in a range of about 1 nm to about 1 micron, or preferably in a range of about 1 nm to about 300 nm, or in a range of about 5 nm to about 100 nm.

In another embodiment, the thermoelectric nanocomposite can include a semiconductor host material and a plurality of nano-sized inclusions (e.g., nanoparticles or nanowires), formed of a semiconductor inclusion material, that are distributed within the host material. The nanocomposite composition exhibits a band-edge offset between the conduction bands or the valence bands of the host material and the inclusion material at an interface that is less than about $5k_BT$, wherein $k_B$ is the Boltzman constant and T is an average temperature of the nanocomposite composition. For example, the band-edge offset can be in a range of about 1 to about 5 $k_BT$, or in a range of about 1 to about 3 $k_BT$. An energy minimum of the conduction band or the valence band of the inclusion material can be preferably less than an energy minimum of a corresponding band of the host material. Alternatively, the energy minimum of a conduction band or a valence band of the host material can be less than an energy minimum of a corresponding band of the inclusion material.

The terms "nano-sized structure" and "nano-sized inclusion," as used herein, generally refer to material portions, such as nanoparticles and nanowires, whose dimensions are equal or preferably less than about 1 micron. For example, they can refer to nanoparticles having an average cross-sectional diameter in a range of about 1 nanometer to about 1 micron, or in a range of about 1 nm to about 300 nm, or in a range of about 5 nm to about 100 nm. Alternatively, they can refer to nanowires having average transverse (cross-sectional) diameter in a range of about 2 nm to about 200 nm.

A variety of different materials can be employed to form the components of the nanocomposite composition. For example, one component (e.g., host material) can comprise PbTe or $PbSe_xTe_{1-x}$ (where x represents the fraction of PbSe in the alloy of PbTe and PbSe, and can be between 0-1) and the other (e.g., inclusion material) can comprise any of PbSe or $PbSe_yTe_{1-y}$. Alternatively, one component can comprise $Bi_2Te_3$ and the other can comprise $Sb_2Te_3$ or $Bi_2Se_3$, or their alloys. In other embodiments, one component can be Si and the other Ge. For example, Si inclusions can be embedded in a Ge or a SiGe alloy host. In another example, the host and the inclusion materials can be formed of SiGe alloys having different relative concentrations of Si and Ge in the host material than in the inclusion material. Those having ordinary skill in the art will appreciate that other materials can also be employed so long as their material properties conform with the teachings of the invention.

In another aspect, the semiconductor component materials (e.g., nano-sized inclusions) can be randomly distributed within the composite. Alternatively, the components can be distributed according to a pattern. Further, one or more components (e.g., the host material or the inclusion material, or both) can be doped with a selected dopant, for example, an n-type or a p-type dopant, with a concentration of, e.g., about 1 percent. In some embodiments that employ Si and Ge materials, boron is utilized as a p-type dopant while phosphorous is employed as an n-type dopant. Those having ordinary skill in the art will appreciate that other dopants can also be employed.

In further aspects, the nanocomposite semiconductor material can exhibit a reduction in thermal conductivity relative to a homogeneous alloy formed of the component materials by a factor of at least about 2, e.g. a factor in a range of about 2 to about 10. Further, the nanocomposite material can exhibit a thermoelectric figure of merit (ZT) that is greater than 1. For example, the figure of merit can be in a range of about 1 to about 4.

In another aspect of the invention, the nanocomposite composition exhibits an electrical conductivity ($\sigma$) that differs, if at all, from an electrical conductivity of a homogeneous alloy formed of the component materials by a factor less than about 4. While in some cases the nanocomposite semiconductor can exhibit an electrical conductivity that is less than that of the homogeneous alloy, in other cases the electrical conductivity of the nanocomposite composition can be greater than that of the homogeneous alloy. The Seebeck coefficient, S, of the nanocomposites can be comparable or greater than that of the homogeneous alloy. Further, the power factor, defined as $S^2\sigma$, can be comparable or greater than that of the homogeneous alloy.

In another embodiment, the invention provides a thermoelectric nanocomposite material that comprises a plurality of nanowires of a first type formed of a selected semiconductor material intermixed with a plurality of nanowires of a second type formed of another semiconductor material. The interfaces between the two types of nanowires exhibit a band-edge discontinuity in any of a conduction band or a valence band that can be less than about $5k_BT$, or preferably less than about $3 k_BT$, wherein $k_B$ is the Boltzman constant and T is an average temperature of the nanocomposite composition. For example, one type of nanowires can be formed of Ge while the other type is formed of Si. While in some embodiments, the nanowires of the first and second types are randomly disposed relative to one another, in other embodiments they are disposed in a three-dimensional pattern relative to one another.

In yet another embodiment, the present invention provides a nanocomposite material formed of a plurality of stacked nanowire structures. Each nanowire structure can comprise an outer shell formed of one semiconductor material and an inner core formed of another semiconductor material, where an interface of the outer shell and the inner core exhibits a band-edge discontinuity between any of a conduction band or a valence band of the outer shell and a corresponding band of the inner core that is less than about $5k_BT$, wherein $k_B$ is the Boltzman constant and T is an average temperature of the nanocomposite composition. The outer shell and inner core can form a coaxial nanowire structure having an average diameter in a range of about 2 nm to about 200 nm. For example, the core can be formed of Si and the shell of Ge, or vice versa.

In other aspects, the invention provides a thermoelectric nanocomposite semiconductor composition that includes a seminconductor host material and a plurality of nano-sized inclusions, formed of a semiconductor inclusion materials, that are distributed within the host material, where a band-edge offset between at least one of a conduction band or a valence band of the host material and a corresponding band of the inclusion material at an interface with the host material is less than about 0.1 eV.

In another aspect, the present invention provides a method of synthesizing a thermoelectric nanocomposite semiconductor composition that includes generating a powder mixture comprising two sets of nano-sized semiconductor structures, and applying a compressive pressure to the mixture while heating it at a temperature and for a time duration chosen to cause compaction of the two sets of nano-sized structures into a nanocomposite material. The compressive pressure can be, for example, in a range of about 10 to about 1000 MPa. Another way to make the nanocomposites is to add nanoparticles or nanowires with higher melting point into a melt of the host material and agitate the mixture through, for example, induction heat caused fluid mixing.

In a related aspect, compression can be enhanced by heating the mixture, e.g., by causing a current density flow through the compressed mixture for heating thereof. In general, the current level (e.g., current density) can depend on the sample size. In some embodiments, a current density in a range of a few thousands $A/cm^2$ (e.g., 2000 $A/cm^2$) can be employed.

Further understanding of the invention can be obtained by reference to the following detailed description in conjunction with the associated drawings, which are briefly described below.

DETAILED DESCRIPTION

The present invention is generally directed to thermoelectric nanocomposite materials, and methods for their fabrication, that generally include a mixture of semiconductor nano-sized structures, or semiconductor nano-sized inclusions embedded in a semiconductor host, that provide a heterogeneous composition. The semiconductor materials are selected so as to substantially preserve electron transport properties of the nanocomposite material relative to the host or a putative homogeneous alloy formed of the semiconductor components while the heterogeneity of the composition enhances phonon scattering, thereby resulting in an enhanced thermoelectric figure-of-merit, as discussed in more detail below.

Figure 1:
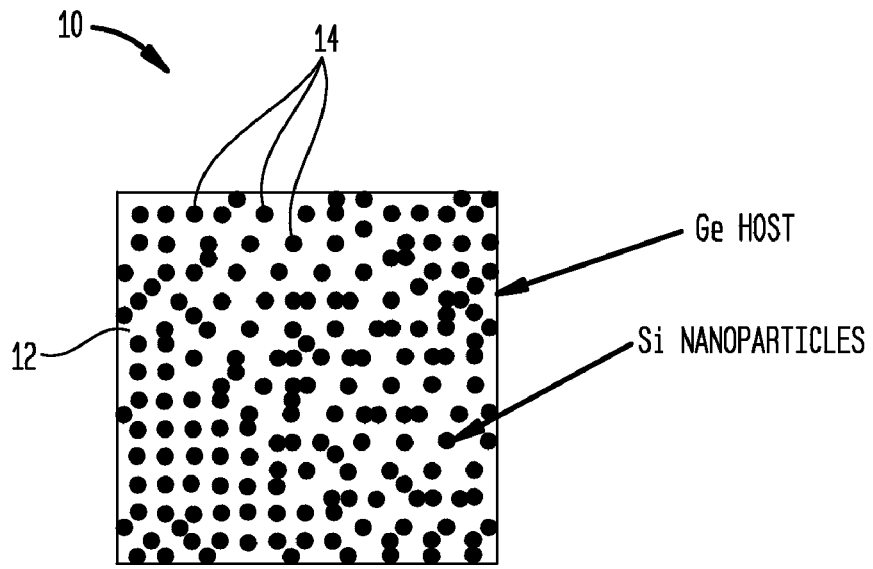
FIG. 1 schematically depicts a thermoelectric nanocomposite composition in accordance with one embodiment of the present invention, FIG. 2A schematically depicts variations of electronic band-edge offset at interfaces of the host and the inclusion materials in the nanocomposite composition of FIG. 1.

With reference to FIG. 1, a thermoelectric semiconductor composition 10 according to one embodiment of the invention includes a host semiconductor material 12 (e.g., Ge or SiGe alloy), herein also referred to as a host matrix, in which a plurality of nano-sized inclusions 14 (e.g., Si or SiGe alloy of a different Ge concentration than a host also formed of a SiGe alloy) are embedded. In this embodiment, the exemplary inclusions are in the form of substantially spherical particles having average diameters in a range of about 1 nm to about 300 nm, or more preferably in a range of about 1 nm to about 100 nm, which are distributed randomly within the host matrix. It should be understood that the shape of the nanoparticles 12 is not limited to spherical. In fact, they can take any desired shape. Further, while in some embodiments, the interfaces between the nanoparticles and the host can be sharp, in other embodiments, an interface can include a transition region in which the material composition changes from that of the host to that of the inclusion.

The nanoparticles 14 are formed of a semiconductor material, herein also referred to as an inclusion material, that has an electronic band structure that is similar to that of the host material, as discussed in more detail below. In this exemplary embodiment, the host material comprises germanium or SiGe alloy while the inclusion material is silicon or SiGe alloy. Alternatively, germanium nanoparticles can be embedded in a silicon host. Both the host material and the inclusion material can be doped with a dopant, e.g., an n-type dopant or a p-type dopant. In general, the doping concentration can be optimized for different materials combinations. In some embodiments, the doping concentration can be, for example, about 1 percent. In other embodiments, the host material can be any of SiGe, PbTe, or $Bi_2Te_3$ while the inclusion material can be any of PbSe, PbSeTe or $Sb_2Te_3$, or vice versa. Other suitable materials can be PbSn, or alloys of PbTeSeSn. Group III-V materials can also be utilized, such as InSb matched to another material or other materials in accordance with the teachings of the invention to other III-V materials. Other examples include HgCdTe system, Bi and BiSb system. Those having ordinary skill in the art will appreciate that other host and inclusion materials can also be employed so long as their electronic and thermal properties conform to the teachings of the invention, as described in more detail below.

In general, the host and the inclusion materials are selected such that a band-edge offset between the conduction bands or the valence bands of the host material and the inclusion material at an interface of the two materials is less than about $5k_BT$, and preferably less than about $3 k_BT$, wherein $k_B$ is the Boltzman constant and T is an average temperature of the nanocomposite composition. For example, the band-edge gap can be less than about 0.1 eV.

Figure 2A:
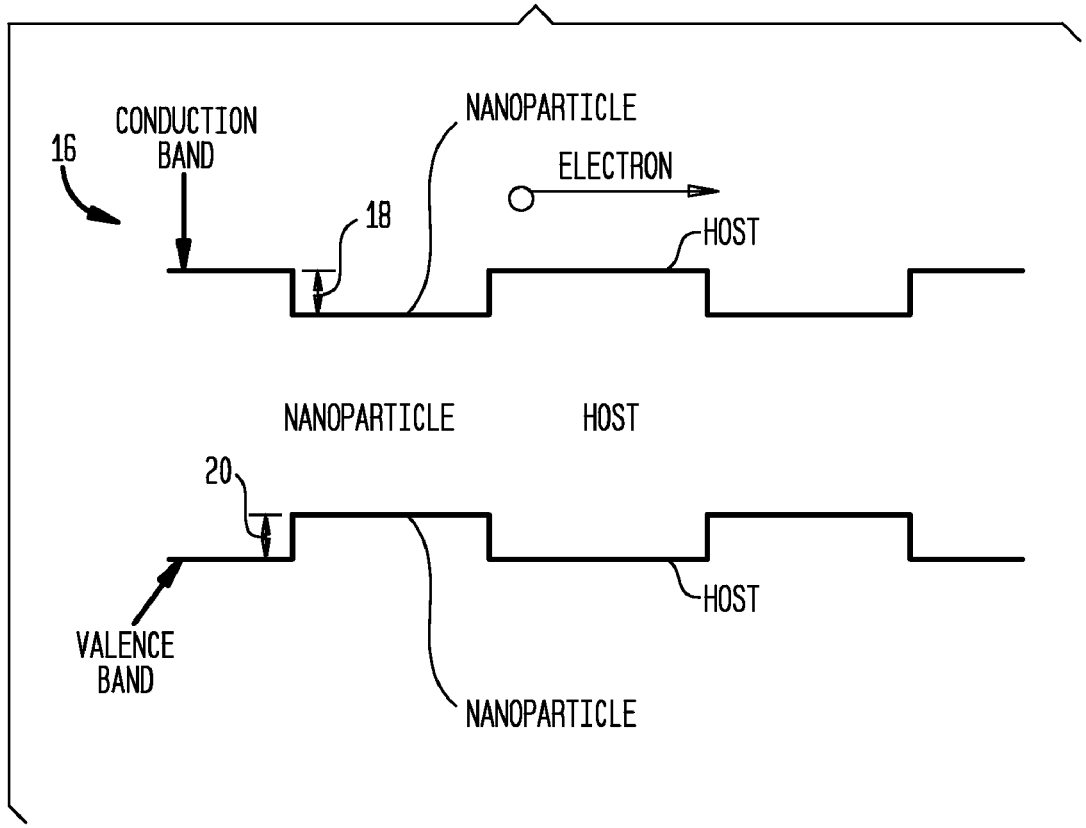
FIG. 2B is a graph illustrating that an energy minimum of the conduction band of n-doped silicon nanoparticles embedded in a germanium host material can be lower (depending on the stress conditions) than the energy minimum of the germanium host's conduction band, FIG. 3 schematically depicts a thermoelectric nanocomposite composition according to another embodiment of the invention in which a plurality of nanoparticles are distributed according to a three-dimensional pattern in a host, FIG. 4 schematically depicts a nanoparticle having a core portion formed of one semiconductor material surrounded by a shell formed of another semiconductor material, FIG. 5A schematically depicts a thermoelectric nanocomposite material according to another embodiment of the invention, which is formed as a mixture of two types of semiconductor nanoparticles, FIG. 5B schematically depicts a nanocomposite material according to one embodiment of the invention that includes a plurality of semiconductor nanoparticles having core-shell structures, FIG. 6A schematically depicts a thermoelectric nanocomposite material according to another embodiment of the invention, which is formed of a stack of segmented nanowires.

The concept of a band-edge offset between two adjacent semiconductor materials is well known. Nonetheless, for further elucidation, FIG. 2A presents a schematic graph 16 illustrating variation of the conduction band and the valence band energies, and more specifically the changes associated with the minimum energy of the conduction band and the maximum energy of the valence band, at interfaces of the host material and the inclusion material in an exemplary thermoelectric semiconductor composition according to some embodiments of the invention, such as the above semiconductor composition 10. The conduction band energies are offset by an amount 18 while the valence band energies are offset by an amount 20 at interfaces of the host and inclusion materials. As noted above, in many embodiments, the offset 18 or 20, or both, are less than about $5k_BT$, wherein $k_B$ is the Boltzman constant and T is an average temperature of the nanocomposite composition. It should also be understood that in some embodiments the nanoparticles can have higher energy conduction bands, or lower energy valence bands, relative to the host so long as energy offsets remain small, e.g. within about $5 k_BT$. Such small band-edge offsets lead to small potential barriers facing electrons at interfaces of the host and the inclusion materials, thereby minimizing electron scattering at these interfaces. In this manner, the electrical conductivity of the nanocomposite composition remains close to that of a putative homogeneous alloy formed from the host and the inclusion materials. For example, the electrical conductivity of the nanocomposite can differ, if any, from that of the putative homogeneous alloy by a factor less than about 4 and in some instances by a factor of 3 or 2. While in many embodiments, the electrical conductivity of the nanocomposite composition is less than that of the putative alloy, in some cases, it can be greater.

Figure 2B:
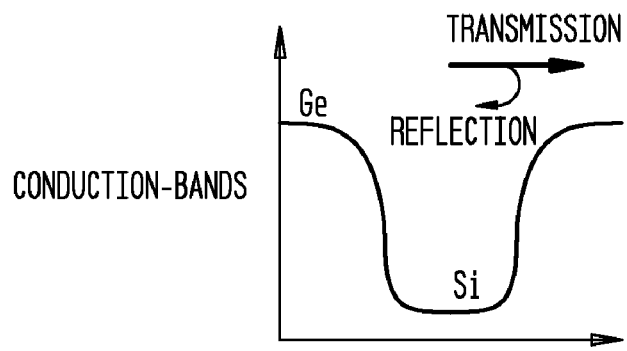

In some embodiments, the host and the inclusion materials are selected such that the energy extrema of either the inclusion material's conduction band or its valence band, or both, are lower than the extremum energy of a corresponding band of the host material. For example, FIG. 2B presents a graph schematically depicting that the conduction band energy of n-doped silicon nanoparticles embedded in a germanium host material can be lower than the conduction band energy of the germanium host.

Figure 3:
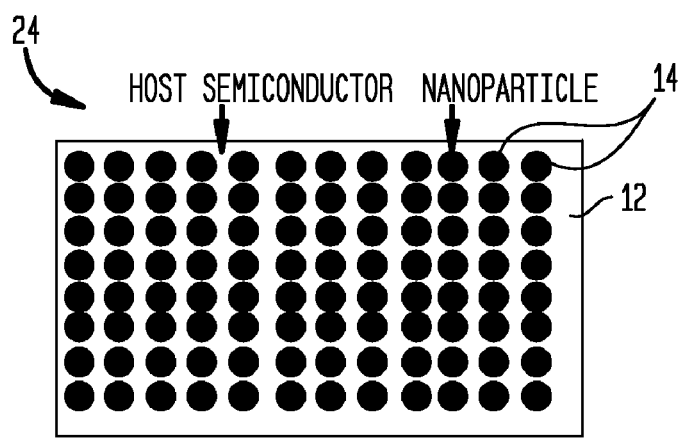

Although the nanoparticles in the above thermoelectric composition 10 are randomly distributed within the host matrix 12, in a nanocomposite composition 24 according to another embodiment of the invention, shown schematically in FIG. 3, the nanoparticles 14 are embedded in the host matrix 12 in accordance with a regular three-dimensional pattern.

Figure 4:
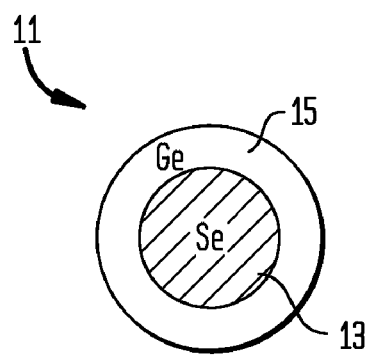

In some embodiments of the invention, the nanoparticles 12 are composed of a core formed of one semiconductor material and a shell surrounding the core, which is formed of another semiconductor material. By of way of example, FIG. 4 schematically depicts one such nanoparticle 11 having a silicon core 13 and a germanium shell 15. Alternatively, the core can be formed of an alloy, e.g., a silicon-germanium alloy, and the shell of a selected semiconductor material, such as germanium. In other embodiments, both the core and shell are formed of semiconductor alloys. For example, both the core and shell can be formed of SiGe alloy, but with different concentrations of Si relative to Ge.

Figure 5A:
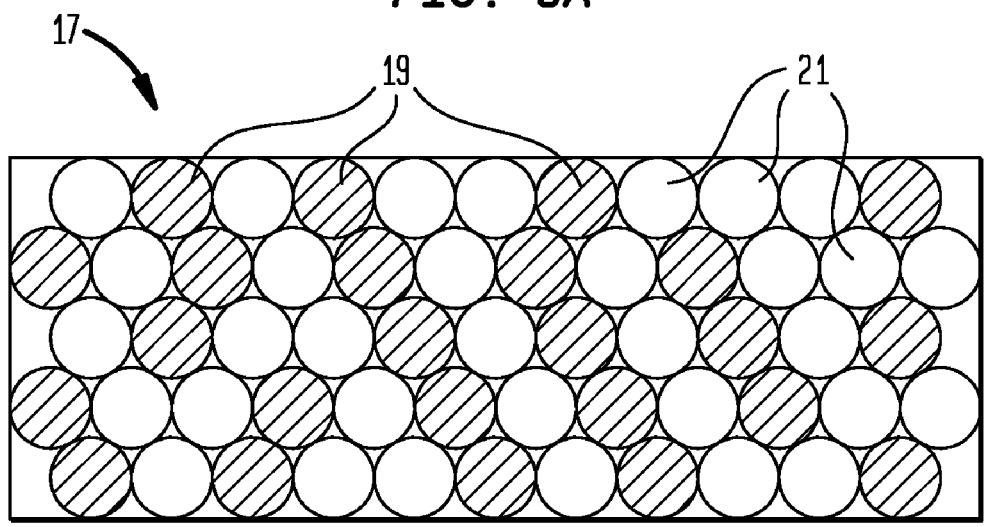

FIG. 5A schematically depicts a thermoelectric nanocomposite composition 17 according to another embodiment of the invention that includes nanoparticles of two types (e.g., formed of two different semiconductor materials) that are intermixed together. Similar to the previous embodiment, the materials of the two types of nanoparticles are chosen such that they exhibit substantially similar electron properties. More particularly, the materials are selected such that a band-edge offset between the conduction bands or the valence bands of the different particle types at interfaces thereof is less than about $5k_BT$, or preferably less than about $3\ k_BT$, wherein $k_B$ is the Boltzman constant and T is an average temperature of the nanocomposite composition. For example, a plurality of nanoparticles 19 (depicted with dashed lines) can be formed of Si while the remaining nanparticles 21 are formed of Ge. In other embodiments the nanparticles 19 and 21 can be formed of SiGe, PbTe, PbSe, PbSeTe, $Bi_2Ti_3$ or $Sb_2Te_3$. For example, one nanoparticle type can be formed of PbSe and other of PbSeTe. Those having ordinary skill in the art will appreciate that other semiconductor materials can also be employed for forming the nanoparticles 19 and 21 so long as their material properties conform with the teachings of the invention. Although in FIG. 5A, for ease of illustration, the nanoparticles of the two types are shown as substantially spherical with the nanocompiste exhibiting some spatial gaps, in many embodiments of the invention the nanoparticles are densely packed together potentially resulting in some distortions of the particles shapes, relative to isolated state, and disappearance of the spatial gaps.

In many embodiments, one or both types of nanoparticles are doped with a selected dopant, e.g., an n-type or p-type dopant. Although the nanocomposite composition 17 is formed of two types of nanoparticles, in other embodiments, a mixture of more than two types of nanoparticles can also be employed. As noted above, the material properties of the nanoparticles are selected such that the differences, if any, among their electronic band structures are minimal.

Figure 5B:
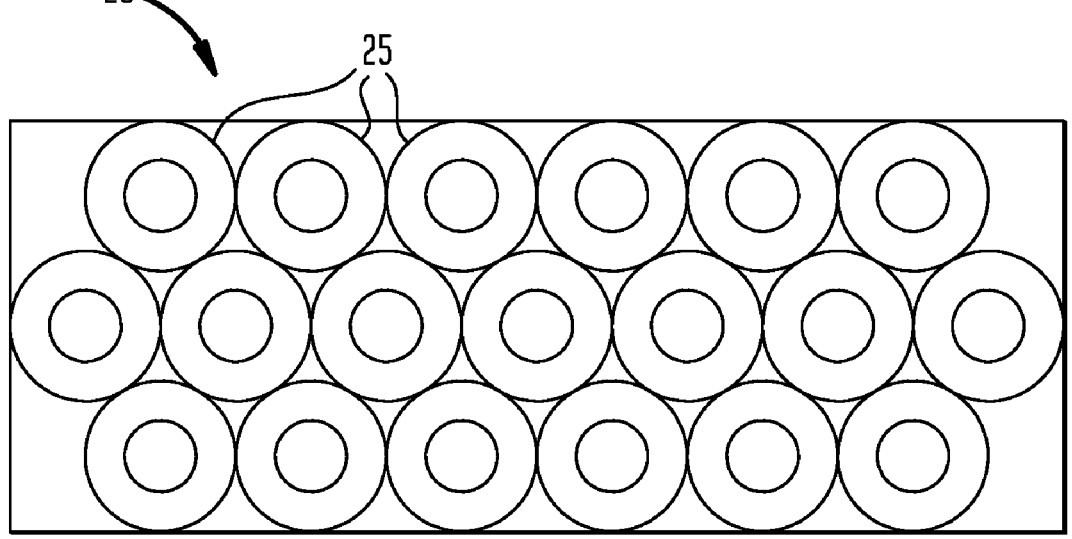

In some embodiments, the nanoparticles 19 or 21, or both, can be a core-shell structure such as that shown in FIG. 4 above. For example, the particles 19 can be formed of a silicon core surrounded by a germanium shell. With reference to FIG. 5B, in another embodiment, a nanocomposite composition 23 is formed of a mixture of nanoparticles 25 that are compacted together, where each nanoparticle has a heterogeneous structure, e.g., a core-shell structure such as that shown in FIG. 3 above. For example, each nanoparticle can have a silicon core and a germanium shell. Alternatively, each nanoparticle can include a SiGe core surrounded by a Si or Ge shell or SiGe alloy with a different composition.

A nanocomposite thermoelectric material accordingly to the teachings of the invention, such as the above compositions 10 and 17, advantageously exhibit an enhanced thermoelectric figure-of-merit (Z) which can be defined as follows:

$$Z = \frac{S^2\sigma}{k}$$

where S is the well-known Seebeck coefficient, σ is the electrical conductivity of the composite material, and k is its thermal conductivity. The figure-of-merit Z has the units of inverse Kelvin. In many cases, a dimensionless figure-of-merit (ZT), obtained as a product of Z and an average device temperature (T), is employed. A nanocomposite thermoelectric composition according to the teachings of the invention, such as the compositions 10 and 17, can exhibit a thermoelectric figure-of-merit (ZT) that can be greater than about 1. For example, it can exhibit a thermoelectric figure-of-merit in a range of about 1 to about 4, or in range of about 2 to about 4. For example, it can exhibit a ZT greater than about 1 at room temperature (about 25 C).

Without being limited to any particularly theory, the enhanced thermoelectric properties of nanocomposite materials of the invention can be understood as being due to a reduction in phonon thermal conductivity while concurrently preserving electron transport properties. For example, in the thermoelectric nanocomposite material 10 described above, the interfaces between the nano-sized inclusions and the host material can cause an increase in phonon scattering, thereby reducing the thermal conductivity of the nanocomposite material. However, the small band-edge offset between the host and the inclusion materials minimizes electron scattering at these interfaces. Even with a small reduction of electrical conductivity, the Seebeck coefficient can be increased such that $S^2\sigma$ would be comparable, or even greater than that of a homogeneous alloy formed of the host and inclusion materials. Such a combination of electron-phonon transport properties can lead to a better thermoelectric figure-of-merit, as can be readily corroborated by reference to the definition of Z above. Particularly, the interfaces between the nanoparticles in the above nanocomposite composition 17 can lead to a lowering of thermal conductivity of the composite relative to a putative homogenous alloy formed of the materials of the two nanoparticle types while small differences between the electronic band structures of the two materials can substantially preserve electron transport properties.

In addition, the thermoelectric nanocomposite materials of the invention can exhibit enhanced power factors, which can be defined as follows:

$$\text{power facto} = S^2\sigma$$

where S is the Seebeck coefficient, and σ is the electrical conductivity of the composite material. For example, power factors in a range of about $2\times10^{-4}$ W/mK to about $100\times10^{-4}$ W/mK$^2$ can be obtained. Without being limited to any particular theory, the power factor enhancement can be due to quantum size effects exhibited by the nano-sized components of the thermoelectric compositions.

Figure 6A:
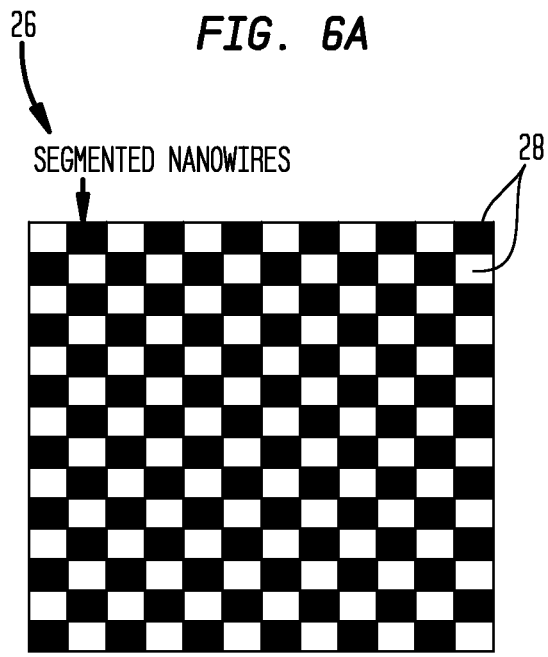
FIG. 6B is a schematic cross-sectional view of a segmented nanowire of the composition of FIG. 6A, FIG. 6C schematically depicts a thermoelectric nanocomposite material according to another embodiment of the invention, formed as plurality of randomly stacked segmented nanowires, FIG. 7A schematically depicts a thermoelectric nanocomposite material according to another embodiment of the invention, formed of a plurality of randomly stacked coaxial nanowires.
Figure 6B:
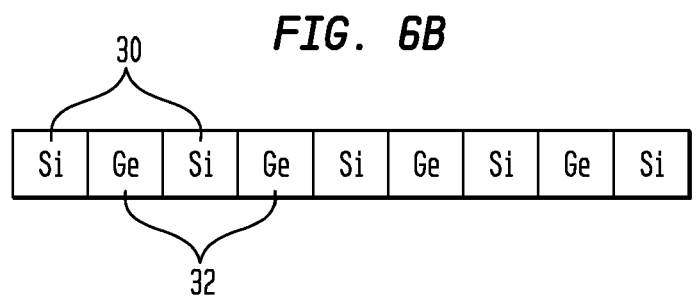

Thermoelectric nanocomposite compositions according to the teachings of the invention are not limited to those described above. By way of example, FIG. 6A schematically illustrates a thermoelectric nanocomposite composition 26 according to another embodiment of the invention that includes a plurality of segmented nanowires 28 that are compacted, in a manner described in more detail below, to form a nancomposite material. With reference to FIG. 6B, each segmented nanowire can include segments 30 formed of one type of semiconductor material interleaved with segments 32 formed of another type of a semiconductor material. For example, the segments 30 can be formed of silicon while the segments 32 are formed of germanium. Those having ordinary skill in the art will appreciate that other semiconductor materials can also be employed for forming these segments. In this exemplary embodiment, the segmented nanowires can have cross-sectional diameters in a range of 1 nm to about 300 nm, and more preferably in a range of about 1 nm to about 20 nm. In general, similar to the previous embodiments, semiconductor materials of the segments 30 and 32 are selected so as to minimize differences between their electronic band structures. More specifically, in many embodiments of the invention, a band-edge offset between the conduction bands or the valence bands of the semiconductor material of the two segment types, at an interface of the two materials, is less than about $5k_BT$, and preferably less than about $3 k_BT$, wherein $k_B$ is the Boltzman constant and T is an average temperature of the nanocomposite composition. For example, the band-edge gap can be less than about 0.1 eV.

Figure 6C:
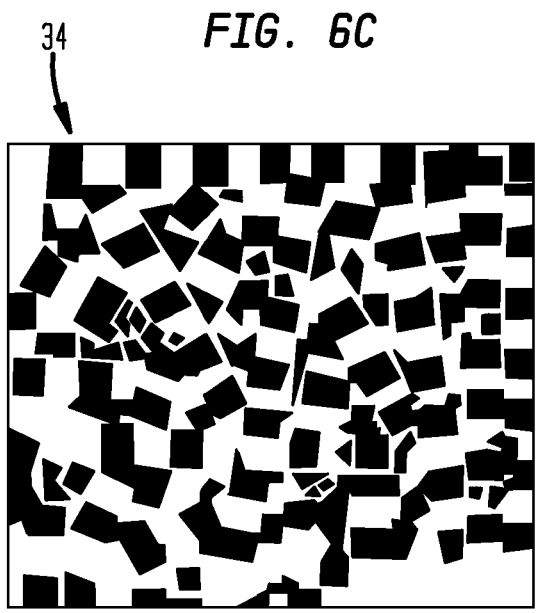

Although the segmented nanowires 28 in the above nanocomposite composition 26 are disposed relative to one another in a regular three-dimensional pattern, in another embodiment 34, shown schematically in FIG. 6C, the nanowires 28 are randomly located relative to one another.

Figure 7A:
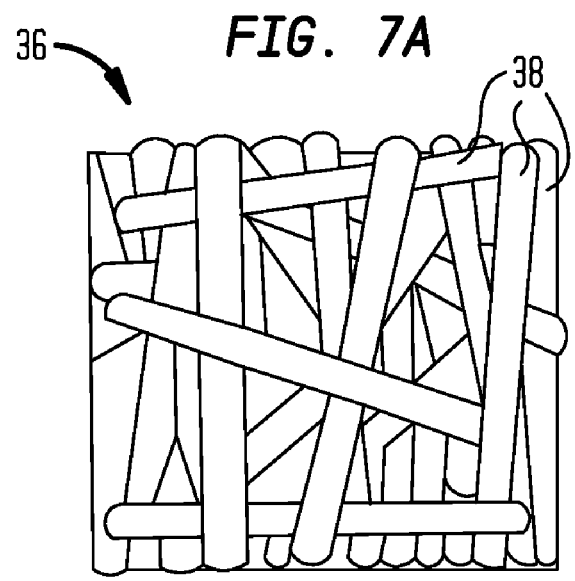
FIG. 7B is a schematic perspective view of a coaxial nanowire of the nanocomposite material of FIG. 7A, FIG. 8 schematically depicts a thermoelectric nanocomposite material formed of a plurality of coaxial nanowires disposed in a three-dimensional pattern relative to one another, FIG. 9 schematically illustrates a vapor phase deposition system for generating nanoparticle and nanowires, FIG. 10 schematically illustrates a plasma compaction apparatus suitable for synthesizing a thermoelectric nanocomposite material from a mixture of nanoparticles.
Figure 7B:
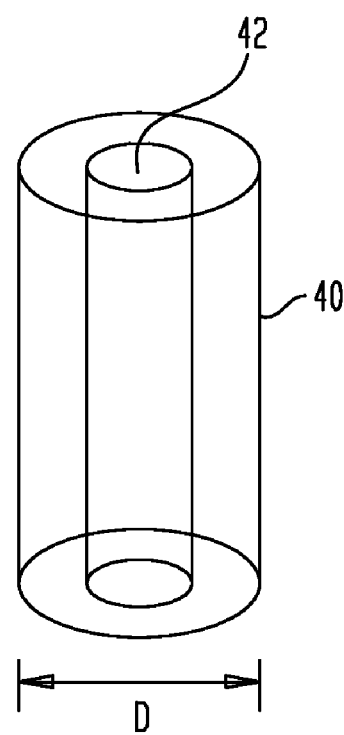

FIG. 7A schematically illustrates a thermoelectric nanocomposite composition 36 according to another embodiment of the invention that is formed of a plurality of stacked nanowire structures 38, each of which is composed of two nanowires disposed substantially coaxially relative to one another. For example, as shown schematically in FIG. 7B, each nanowire structure 38 can include an outer shell 40 formed of a semiconductor material that surrounds an inner core 42, which is formed of another semiconductor material. The coaxial nanowire 38 can have a cross-sectional diameter D in a range of about 1 nm to about 1 micron, or in a range of about 1 nm to about 300 nm, and more preferably in a range of about 1 nm to about 100 nm.

The semiconductor materials for forming the nanowire structures 38 are selected such that an interface of the outer shell and the inner core would exhibit a band-edge offset between conduction bands or the valence bands of the outer shell and corresponding bands of the inner core less than about $5k_BT$, wherein $k_B$ is the Boltzman constant and T is an average temperature of the nanocomposite composition. For example, the band-edge gap can be less than about 0.1 eV.

The heterogeneity of the nanocomposite composition 36, e.g., the interfaces between the outer shells and the inner cores of the nanowire structures forming the composition, can increase phonon scattering, thereby reducing the composition's thermal conductivity. The electrical conductivity is, however, less affected because the semiconductor materials of the outer shells and the inner cores are chosen so as to minimize differences between their electronic band structures. In other words, the heterogeneity of the composition can affect phonon scattering without substantially altering electron transport properties, thereby resulting in enhanced thermoelectric properties of the composition.

Although in the above thermoelectric composition the nanowire structures include two layers—an inner core surrounded by an outer shell—in other embodiments, more than two layers, e.g., two coaxially disposed shells surrounding an inner core, can be employed. Further, although the coaxial nanowires 38 in the above composition 36 are disposed randomly relative to one another, in another embodiment 44, shown schematically in FIG. 8, the coaxial nanowires are arrange relative to one another according to a three-dimensional pattern.

A variety of techniques can be employed to fabricate thermoelectric nanocomposite compositions according to the teachings of the invention, such as those described above. In general, known techniques, such as, wet chemistry techniques and vapor-liquid-solid condensation, can be utilized to generate the nanostructures, e.g., nanoparticles or nanowires. These nanostructures are preferably incorporated within a host material, or intermixed with one another, while taking precautions to avoid generation of interface states, e.g., interface oxides, that could contribute to electron scattering, as discussed in more detail below. For example, silicon nanoparticles can be treated in an HF solution to remove any $SiO_2$ coating formed thereon.

In one method, a host material is impregnated with nanoparticles by taking advantage of a difference between the melting temperature of the host and that of the nanoparticles. For example, nanoparticles can be embedded within a host material having a lower melting point than that of the nanoparticles. Some illustrative examples of such nanoparticles and host materials include: Si nanoparticles embedded in a Ge host, PbSe nanoparticles inside a PbTe host, and $Sb_2Te_3$ nanoparticles inside a $Bi_2Te_3$ host. Dopants can also be incorporated into the host and the nanoparticles. In some embodiments, dopants can be directly added to the host. More preferably, dopants can be added to the nanoparticles in addition to the host.

In many fabrication techniques, nanoparticles and nanowires are utilized as building blocks for generating nanocomposite materials according to the teachings of the invention. Hence, exemplary methods for generating some exemplary nanoparticles as well as nanowires are described below. Those having ordinary skill in the art will appreciate that similar techniques can be utilized for forming nanoparticles and nanowires of other materials.

In many embodiments of the invention, nanoparticles, such as Si or Ge nanoparticles, are synthesized by employing wet chemistry or vapor deposition techniques. Both water-based and non-water-based wet chemistry techniques can be employed. By way of example, Ge nanocrystals can be synthesized by utilizing a low temperature inverse micelle solvothermal method—a non-water-based technique—that is capable of yielding gram quantity of Ge nanocrystals. The preparation of Ge nanoparticles can be performed, for example, in a Parr reactor (e.g., model 4750, Parr Company, Moline, Ill., USA). A typical exemplary procedure for preparing Ge nanospheres can be as follows: 80 mL of hexane, 0.6 mL of GeCl4, 0.6 mL of phenyl-GeCl3, 0.6 mL of pentaethylene glycol monododecyl ether (C12E5), and 5.6 mL of Na (25 w% dispersion in toluene) can be added to a 200 mL flask. This mixture can be stirred for about 30 minutes, for example, via a magnetic stirrer, and subsequently transferred to a Parr reactor. The Parr reactor can be kept at an elevated temperature, e.g., at 280 C, for about 72 hours in a furnace without stirring or shaking and then cooled to room temperature.

Germanium nanospheres can then be obtained from a black powder collected at the end of the above process by washing the powder with excess amounts of hexane, alcohol, and distilled water in order to remove any NaCl byproducts and hydrocarbon residue. This can be followed by a drying step performed, e.g., in an oven, at 60 C for about 12 hours. Experimental characterizations of prototype Ge nanoparticles synthesized by the above procedure indicate these particles have crystalline structure and nanometer sizes, e.g., a diameter of about 20 nm. A similar approach can be utilized for synthesizing silicon nanoparticles. In preferred embodiments, the above synthesis steps are preferably performed under an inert atmosphere, e.g., an atmosphere of argon, so as to inhibit formation of surface oxide layers that can degrade thermoelectric properties of nanocomposite materials generated by employing the nanoparticles, as discussed in more detail below.

The above wet chemistry approach can also be utilized to form nanoparticle having a core portion surrounded by a shell, such as the above nanoparticle 11 shown schematically in FIG. 4. For example, a nanoparticle having a germanium core and silicon shell can be synthesized by forming Ge core first, and subsequently the Si shell in Ge- and Si-containing solution respectively.

As another example, PbSe nanoparticles can be synthesized by utilizing a water-based wet chemistry protocol described briefly below. For example, in one embodiment, 50 milliliter of water can be mixed with 50 mg of a surfactant, e.g., PEG, and 1.3 grams of sodium hydroxide (NaOH). To this mixture, 78 mg of Se and 378 mg of lead acetate, i.e., $Pb(CH_2COOH)_2.3H_2O$, can be added. This is followed by adding a reducing agent (e.g., $N_2H_4.H_2O$) to the mixture while stirring it. The mixture can then be held in a pressure vessel at a temperature of about 100 C for about 18 hours, and the resultant material can be washed with water/ethanol to obtain PbSe nanoparticles having average diameters of about 28 nm. The above volumes and masses of different reagents are given for illustrative purposes, and those having ordinary skill in the art will appreciate that other values can also be employed.

In another example, PbTe nanoparticles can also be synthesized in a similar manner. For example, in one approach, 50 milliliter of water can be mixed with 50 mg of a surfactant, e.g., PEG, and 2.4 grams of sodium hydroxide (NaOH). To this mixture, 127 mg of Te and 420 mg of lead acetate, i.e., $Pb(CH_2COOH)_2.3H_2O$, can be added. This is followed by adding a reducing agent (e.g., $N_2H_4.H_2O$) to the mixture while stirring it. The mixture can then be held in a pressure vessel at a temperature of about 160 C for about 20 hours, and the resultant material can be washed with water/ethanol to obtain PbTe nanoparticles having average diameters of about 10 nm. The above volumes and masses of different reagents are given for illustrative purposes, and those having ordinary skill in the art will appreciate that other values can also be employed.

In some cases, vapor phase deposition techniques can be employed for synthesizing nanoparticles and nanowires needed for fabricating nanocomposite materials according to the teahchings of the invention. For example, in one approach, vapor phase deposition can be utilized for synthesizing Si nanowires and nanoparticles. For example, FIG. 9 schematically illustrates a system 46 for synthesizing Si nanowires and nanoparticles via vapor phase deposition, which includes a graphite boat 48 with one small opening at each end thereof that is placed in a furnace 50. A source material, e.g., silicon monoxide or silane gas ($SiH_4$) (e.g., 99.5%), is disposed at a higher temperature end of the boat. The system can then be evacuated to a low pressure, e.g., 0.01 Torr, by a pump, e.g., a rotary pump, and a flowing carrier gas (e.g., argon with high purity mixed with 50% hydrogen) can be introduced into the boat from one end. In this exemplary embodiment, the gas flow rate is selected to about 100 sccm and the pressure is kept at about 100 Torr. Those having ordinary skill in the art will appreciate that other gas flow rates can also be employed. The system can be heated to about 1350 C at the source position and held at this temperature for about one hour. The gas flow carries vapor from the source downstream portion of the tube to be deposited on a substrate, e.g., a silicon substrate, held at a lower temperature than that of the source (e.g., at 1100 C), to initiate the growth of silicon nanowires and nanoparticles.

After completion of the growth process, the silicon structures can be soaked in a solution of hydrofluoric acid (HF) having a concentration of about 10% to remove oxide layers, if there are such layers, and obtain silicon crystal silicon nanowires and nanoparticles. Scanning electron microscopy (SEM) images of prototype silicon structures formed according to the above procedure show a plurality of substantially uniformed-sized silicon nanoparticles and a plurality of nanowires formed between adjacent nanoparticles. And selected area electron diffraction (SAED) spectra show that the nanoparticles are composed of a crystalline core and an amorphous outer layer. Application of a HF solution having a selected concentration, e.g., about 10%, to these silicon-knotted nanowires can result in obtaining free-standing silicon nanoparticles. Alternatively, the silicon nanowires can be utilized.

Segmented and coaxial nanowires constitute other building blocks needed for synthesizing nanocomposite compositions according to some embodiments of the invention, such as the compositions 26 and 36 described above. Various techniques are known in the art for generating such nanowires. For example, in order to synthesize segmented nanowires having Si and Ge segments, a vapor phase deposition system, such as the above system 46, with a Si source and a Ge source can be employed. The sources can be activated in an alternating fashion to deposit segmented nanowires on a substrate placed downstream of the sources. In another example, PbSe/PbTe segmented nanowires can be fabricated via electrodeposition onto an alumina ($Al_2O_3$) template. Aqueous deposition baths having lead acetate as a source for lead, and $SeO_2$ and $TeO_2$ as sources of selenium and tellurium, respectively, can be employed. The alumina template can be transferred back and forth between the two corresponding deposition baths, and the deposition potentials can be cycled accordingly. For generating coaxial wires, once nanowires of one type, e.g., silicon, are formed on the substrate in a manner described above, the other source, e.g., a Ge source, can be activated to coat the first wires with a shell, e.g., a shell of Ge.

Figure 10:
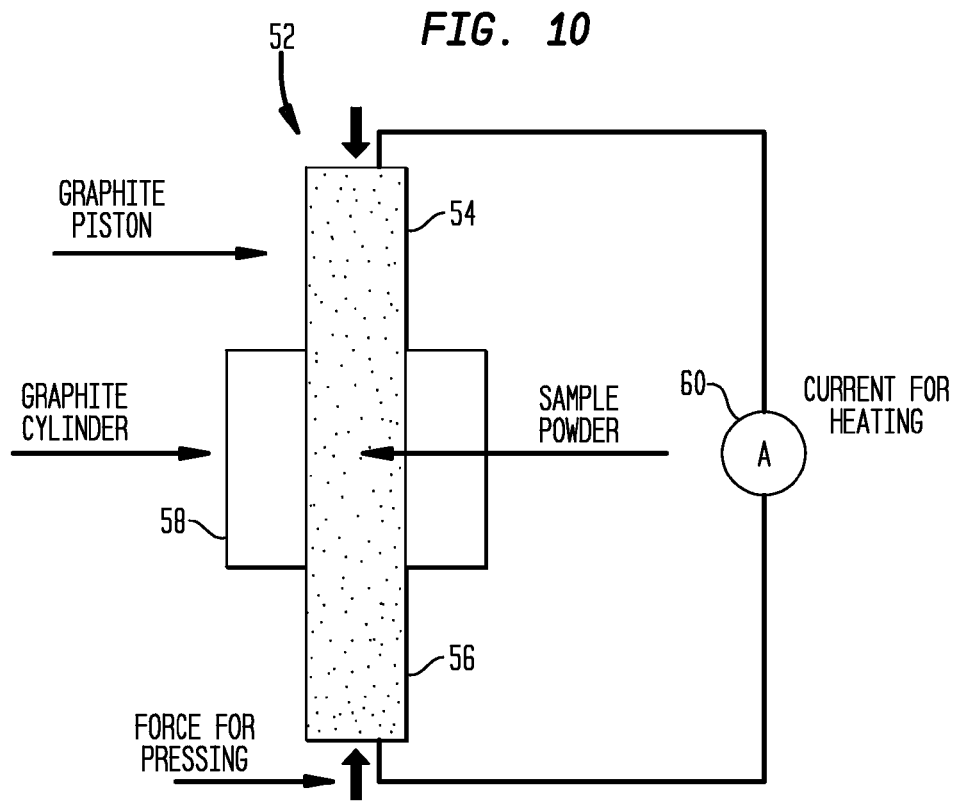

In one exemplary method according to the teachings of the invention, the nanoparticles and the nanowires are compacted at an elevated temperature and under compressive pressure to synthesize a nancomposite composition, such as those described above. By way of example, a plasma pressure compaction apparatus 52, schematically depicted in FIG. 10, can be employed for this purpose. Two graphite pistons 54 and 56 apply a high compressive pressure, e.g., a pressure in a range of about 10 to about 1000 MegaPascals (MPa), to a nanoparticles mixture disposed within a graphite cylinder 58, while a current source 60 provides a current density flow through the mixture for heating thereof. In many embodiments, the current density is in a range of about 1000 A/cm$^2$ to about 2000 A/cm$^2$. The temperature of the mixture, or an estimate thereof, can be obtained by measuring, for example, the temperature of the graphite cylinder via an optical pyrometer (not shown) or a thermocouple attached to the sample surface. The temporal duration of the applied pressure as well as the temperature of the mixture while under pressure are selected so as to cause formation of a nanocomposite composition of interest while inhibiting formation of a homogeneous alloy consisting of the semiconductor components in the mixture.

For example, for forming a nanocomposite material comprising Si inclusions in a Ge host and one consisting of a mixture of Si and Ge nanoparticles, a powder mixture of Si and Ge nanoparticles can be placed under a compressive pressure of about 127 MPa while flowing a current through the powder. The current can be increased in steps of 200 A every two minutes until the temperature of the mixture reaches about 850 C. The mixture is then held at this temperature under the compressive pressure for about 5 minutes, and subsequently cooled down, e.g., via water cooling of the pistons, over a period of 1 to 2 minutes. Typically, for generating Si/Ge nanocomposites, the temperature of the mixture under pressure is held below the melting temperature of germanium.

Figure 11:
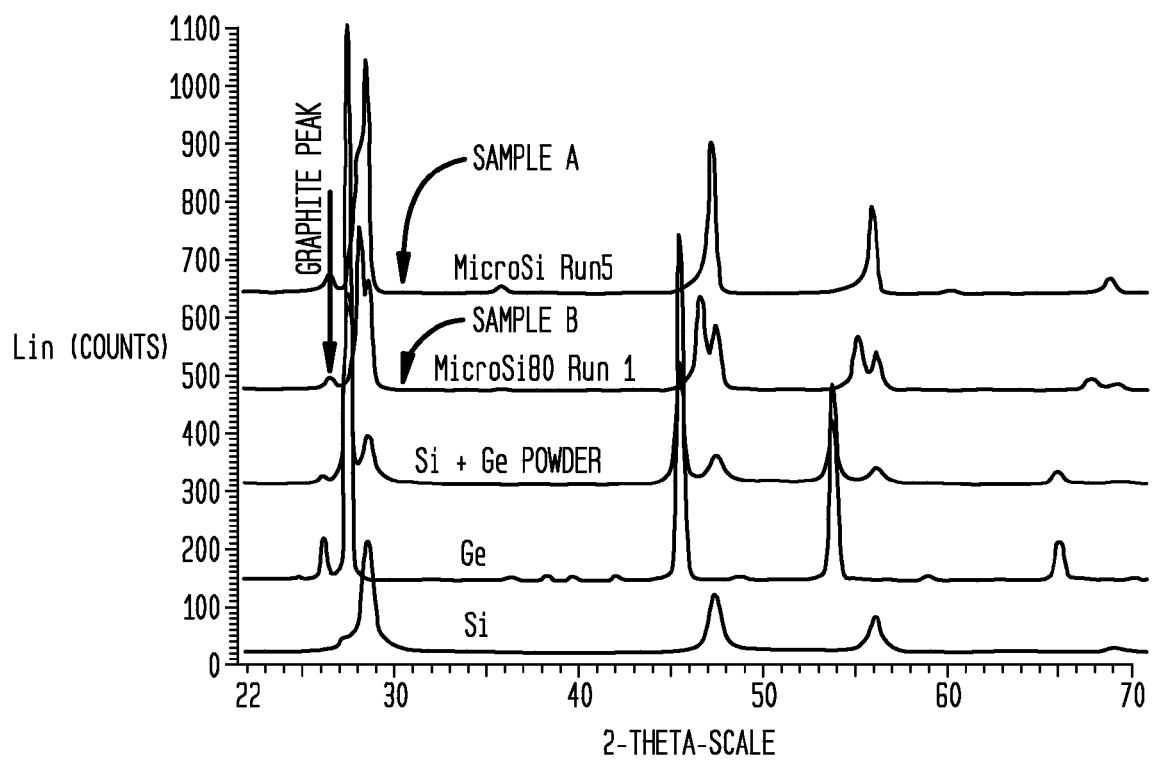
FIG. 11 presents X-ray diffraction data corresponding to two prototype nanocomposite samples according to the teachings of the invention as well as a silicon sample, a germanium sample, and a sample composed of a powder mixture of silicon and germanium, FIG. 12 schematically depicts a thermoelectric cooler formed as a cascade of thermoelectric modules fabricated by employing thermoelectric nanocomposite materials of the invention, and FIG. 13 schematically depicts a thermoelectric device for converting heat to electricity.

By way of example and to illustrate the efficacy of the above methods for generating thermoelectric nanocomposite materials according to the teachings of the invention, FIG. 11 presents X-ray diffraction data corresponding to two prototype nancomposite samples, herein designated as samples A and B, generated by incorporating nano-sized silicon inclusions in a germanium host matrix in comparison with similar data for a silicon sample, a germanium sample, and a sample composed of a powder mixture of silicon and germanium. This exemplary data provides clear evidence of two compositions within the nanocomposite samples.

Figure 12:
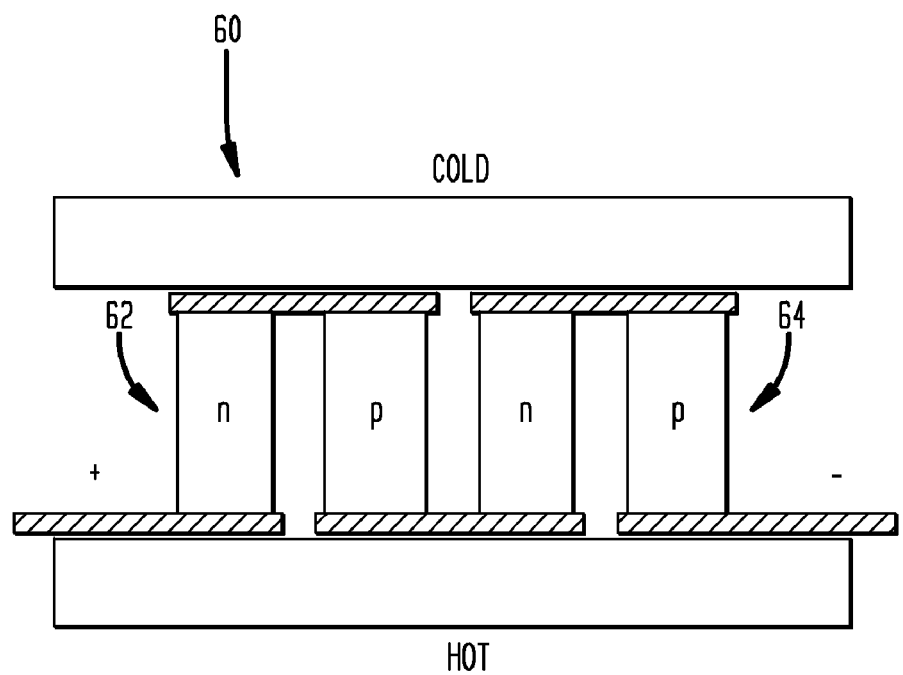

Thermoelectric nanocomposite materials of the invention can advantageously find applications in both refrigeration and power generation. For example, they can be utilized in thermal management of microelectronics and photonic devices. Further, they can be employed as thermoelectric power generators for direct conversion of thermal energy to electrical energy at a high efficiency. By way of example, FIG. 12 schematically depicts a thermoelectric cooler 60 formed as an assembly of thermoelectric elements, such as modules 62 and 64. The elements are electrically connected in series (or a combination of serial and parallel connections depending on the needs and power supplies) with current flowing alternatively through p-type and n-type legs (formed of doped nanocomposites of the invention). The legs of the devices are connected through electrically conductive bridges to adjacent legs in a cascading fashion. Application of a current through the modules causes transfer of heat from one side of the thermoelectric cooler to the other, thereby lowering the temperature at one side while increasing the temperature at the opposed side.

Figure 13:
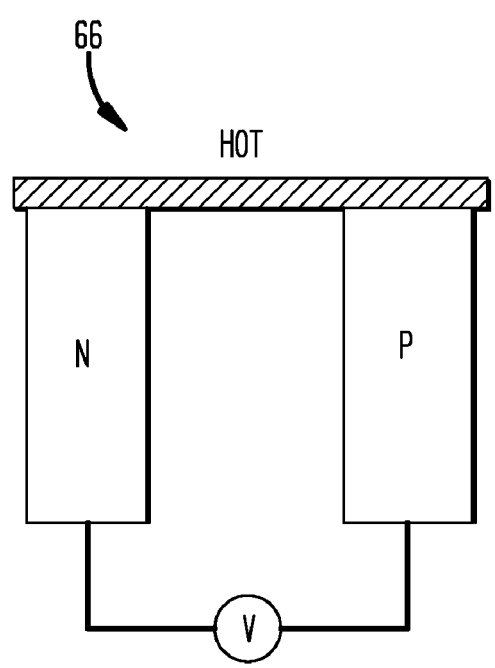

Alternatively, as shown in FIG. 13, heat can be applied to one side of a thermoelectric device 66 having n-type and p-type portions—connected via an electrically conductive bridging segment—to generate an electrical voltage across those portions.

Those having ordinary skill in the art will appreciate that various modifications can be made to the above embodiments without departing from the scope of the invention.

What is claimed is:

1. A method of synthesizing a thermoelectric nanocomposite semiconductor composition, comprising
    generating a powder mixture comprising two or more sets of nano-sized semiconductor structures,
    applying a compressive pressure to said mixture while flowing current through said mixture to heat the mixture to a selected temperature for a time duration selected to cause compaction of said sets of nano-sized structures into the thermoelectric nanocomposite semiconductor composition having a matrix with nano-sized inclusions.

2. The method of claim 1, wherein said compressive pressure is in a range of about 10 to about 1000 MPa.

3. A method of synthesizing a thermoelectric nanocomposite semiconductor composition, comprising
    generating a powder mixture comprising two or more sets of nano-sized semiconductor structures,
    applying a compressive pressure to said mixture while heating the mixture to a selected temperature for a time duration selected to cause compaction of said sets of nano-sized structures into the thermoelectric nanocomposite semiconductor composition, and
    flowing current through said mixture under compressive pressure to heat the mixture, wherein said current is in a range of about 1000 to about 2000 A/cm$^2$
    wherein said current, said compressive pressure and said time duration are selected to substantially inhibit formation of a homogenous alloy composed of materials forming said nano-sized structures while facilitating formation of the nanocomposite semiconductor composition.

4. The method of claim 1, wherein said nano-sized structures are semiconductor nanoparticles and the semiconductor nanoparticles of one set have a different composition from the semiconductor nanoparticles of another set.

5. A method of synthesizing a thermoelectric nanocomposite semiconductor composition, comprising
    generating a powder mixture comprising two or more sets of nano-sized semiconductor structures,
    applying a compressive pressure to said mixture while heating the mixture to a selected temperature for a time duration selected to cause compaction of said sets of nano-sized structures into the thermoelectric nanocomposite semiconductor composition, wherein said nano-sized structures of one set are nanowires.

6. A method of generating a thermoelectric nanocomposite semiconductor composition, comprising:
    generating a powder mixture comprising at least two sets of nanoparticles, wherein at least one set is formed of a host semiconductor material and at least another set is formed of an inclusion semiconductor material, and
    applying a compressive pressure to said mixture while heating the mixture with an electric current to a selected temperature so as to cause compaction of said mixture into the thermoelectric nanocomposite semiconductor composition having said inclusion nanoparticles distributed in a host matrix formed of said host semiconductor material, wherein said inclusion particles in the nanocomposite are nano-sized.

7. The method of claim 6, wherein said compressive pressure is in a range of about 10 to about 1000 MPa.

8. The method of claim 6, wherein the host semiconductor material is different from the inclusion semiconductor material.

9. The method of claim 1, wherein the nano-sized inclusions have a size of 1-300 nm.

10. The method of claim 9, wherein the nano-sized inclusions have a size of 1-100 nm.

* * * * *